United States Patent
Lee

(10) Patent No.: US 6,404,677 B2
(45) Date of Patent: Jun. 11, 2002

(54) SEMICONDUCTOR MEMORY DEVICE CAPABLE OF PERFORMING STABLE READ OPERATION AND READ METHOD THEREOF

(75) Inventor: Dong-woo Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/731,459

(22) Filed: Dec. 6, 2000

(30) Foreign Application Priority Data

Dec. 6, 1999 (KR) .......................................... 99-55215

(51) Int. Cl.[7] .............................................. G11C 16/06
(52) U.S. Cl. .................... 365/185.2; 365/210; 365/207; 365/189.07
(58) Field of Search ............................. 365/185.2, 210, 365/207, 203, 204, 205, 194, 189.09, 189.07, 191

(56) References Cited

U.S. PATENT DOCUMENTS 6,018,487 A * 1/2000 Lee et al. .................... 365/204
6,104,656 A * 8/2000 Jung ........................... 365/207

FOREIGN PATENT DOCUMENTS

JP            408063978 A  *  3/1996     ......... G11C/11/419

* cited by examiner

Primary Examiner—David Lam
(74) Attorney, Agent, or Firm—Marger Johnson & McCollom, P.C.

(57) ABSTRACT

A memory device includes a sense amplifier circuit that is composed of a reference voltage generator, a differential amplifier, and a sensing voltage generator, and a sense amplifier controller that controls an operation of the sense amplifier circuit. The reference voltage generator is enabled depending upon control of the sense amplifier controller before the sensing voltage generator is enabled. As a result, a reference voltage from the reference voltage generator is set to required voltage level, earlier than that from the sensing voltage generator.

13 Claims, 5 Drawing Sheets

SEMICONDUCTOR MEMORY DEVICE CAPABLE OF PERFORMING STABLE READ OPERATION AND READ METHOD THEREOF

This application relies for priority upon Korean Patent Application No. 1999-55215, filed on Dec. 6, 1999, the contents of which are herein incorporated by reference in their entirety.

FIELD OF THE INVENTION

The present invention relates to a semiconductor memory device and, more particularly, to a sense amplifier circuit applied to a semiconductor memory device.

BACKGROUND OF THE INVENTION

The more densely memory devices are integrated, the more memory cells therein are shrunk. This causes current drivability of the memory cell to be degraded.

In a semiconductor memory device taken in a portable electric apparatus operable with a low voltage, a memory cell current required to sense data is even more degraded, because the device is operating at a very low voltage. When the current flowing through a memory cell becomes less, an operation speed of a sense amplifier circuit for sensing a state of the memory cell become slower, due to the weak current drivability of the memory cell. As a result, an overall accessing time of the semiconductor memory device becomes longer.

The facility of a sense amplifier circuit greatly affects the performance of the semiconductor memory device. Such is made more clear from the below.

Referring to FIG. 1, a sense amplifier circuit is constructed with a differential amplifier that senses and amplifies a voltage difference between two input signals. The differential amplifier can include two input transistors, a current sink (composed of a MOS transistor) serially coupled to the input transistors, and a current mirror. An input voltage to be sensed is applied to a control gate of one of the input transistors. The input of the sense amplifier is decided by a cell current flowing through a cell ("on-cell" or "off-cell").

In the conventional sense amplifier circuit of FIG. 1, one input terminal of a differential amplifier 12 is coupled to a node DS0 (hereinafter referred to as "reference node") to which a dummy load (or current source) 14 and a dummy cell 18 are coupled, respectively. The other input terminal of the differential amplifier 12 is coupled to a node S0 (hereinafter referred to as "input node") to which a main node 16 and a memory cell 20 are coupled, respectively. The dummy cell 18 is constructed to maintain an intermediate current drivability that is between those of the one-cell and the off-cell.

The operation is now described also with reference to FIG. 2. It is first assumed that both the dummy load 14 and the main load 16 supply the same amount of current as flows through the dummy cell 18. When a read operation is started, voltages (i.e., the reference voltage and input voltage) of the nodes DS0 and S0 gradually increase by an amount of current that is supplied through the corresponding loads 14 and 16. After a predetermined time T2, the voltage of the reference node DS0 stabilizes at its initial level, while that of the input node S0 diverges.

More particularly, the voltage level at input node S0 follows a state (an on-cell or an off-cell) of a memory cell. For example, if the memory cell 20 is an on-cell, the input voltage becomes lower than the reference voltage. On the other hand, if the memory cell 20 is an off-cell, the input voltage becomes higher than the reference voltage. The differential amplifier 12 senses the voltage different between the input and reference voltages. Depending upon the sensed result, a signal OUT with high or low level is generated from the sense amplifier circuit 10.

The reference voltage of the reference node DS0 and the input voltage of the sensing node S0 are created at the same time. Namely, at the beginning of the read operation, the voltages of the nodes DS0 and S0 are set to required voltage levels.

Then, the sensing operation is started to compare the input responding to a state of the memory cell with the reference voltage. The sensing operation takes place long enough after divergence has started, so as to secure a comfortable sensing margin.

In real applications, there are problems caused by capacitance imbalance between the reference and sensing nodes that are the input terminals DS0, S0 of the differential amplifier 12. Such problems include performance degradation of the sense amplifier circuit, and cannot be easily solved by conditioning circuit design parameters with stably predictable features.

Continuing to refer to FIG. 2, if a load at the reference node DS0 is greater than that at the sensing node S0, the actual rise time will be T1 instead of T2 (following the dashed line). This will not give enough opportunity to the voltages of the nodes DS0 and S0 to diverge enough from each other, so as to secure a stable sensing margin of a sense amplifier circuit. This prevents a read operation from being stable, which can result in read-out failure in the worst case.

SUMMARY OF THE INVENTION

It is an object of the invention to provide a semiconductor memory device capable of stabilizing a sensing operation.

It is another object of the invention to provide a semiconductor memory device capable of preventing read-out failure caused by a discord of set-up timing between a reference voltage and an input voltage of a sense amplifier.

According to one aspect of the present invention, a semiconductor memory device includes a memory cell array in which rows and columns are arranged. The semiconductor memory device includes at least one dummy cell, a sense amplifier circuit, and a sense amplifier controller. The sense amplifier circuit is coupled to the dummy cell, and internally generates a reference voltage in response to first control signals. The sense amplifier controller generates first and second control signals during a read operation. The first control signals are enabled before the second control signals are enabled, such that the reference voltage is set to constant voltage level. The sense amplifier circuit senses data stored in the selected memory cells in response to the reference voltage and to the second control signals.

According to another aspect of the present invention, there is a method of reading data stored in a semiconductor memory device that includes a memory cell array in which rows and columns are arranged, and a sense amplifier circuit for sensing a state of a selected memory cell. A reference voltage is generated using a dummy cell coupled to the sense amplifier circuit, and is set to constant voltage level. Then, a state of the selected memory cell is sensed in response to the reference voltage.

DESCRIPTION OF THE PREFERRED EMBODIMENTS

A memory device according to the invention includes a memory cell array (not shown) in which rows and columns are arranged. Memory cells are arranged at the intersections of the rows and the columns.

The memory device also includes a sense amplifier circuit that is set to the required voltage level by a reference voltage generator. The established reference voltage is forced to retain the voltage level as long as the memory device operates.

Then, the sense amplifier circuit is controlled such that a sensing voltage generator detects a state of a selected memory cell. The reference voltage is established at its effective level before a sensing operation, thereby preventing the problems of the prior art. Further, a voltage at the reference node does not fluctuate while the sensing operation takes place, thereby reducing noise in the sense amplifier circuit.

Figure 1:
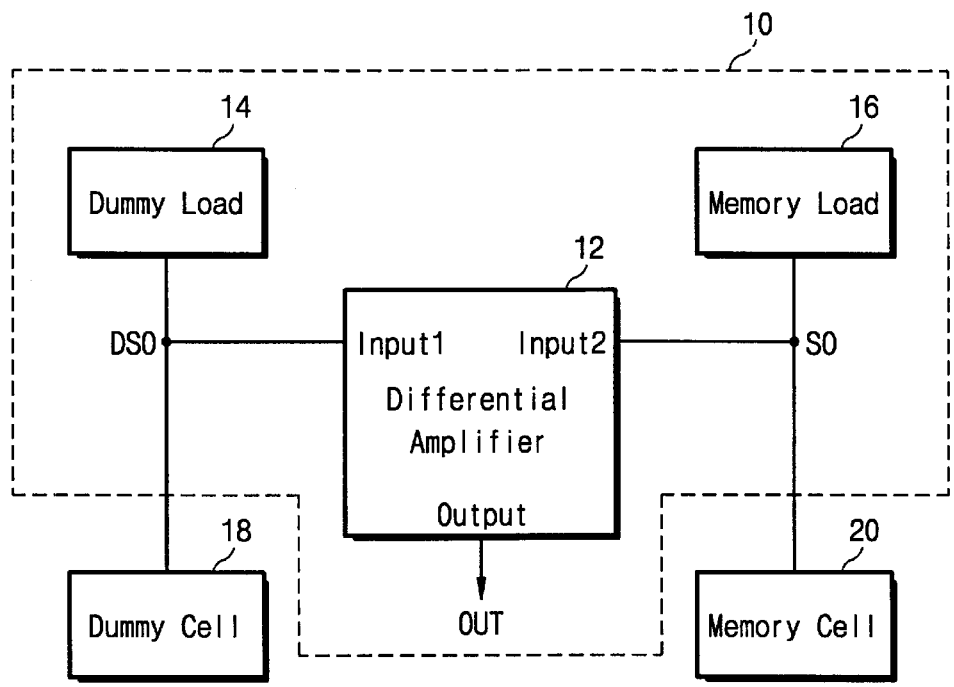
FIG. 1 is a block diagram of sense amplifier circuit in accordance with a prior art.
Figure 2:
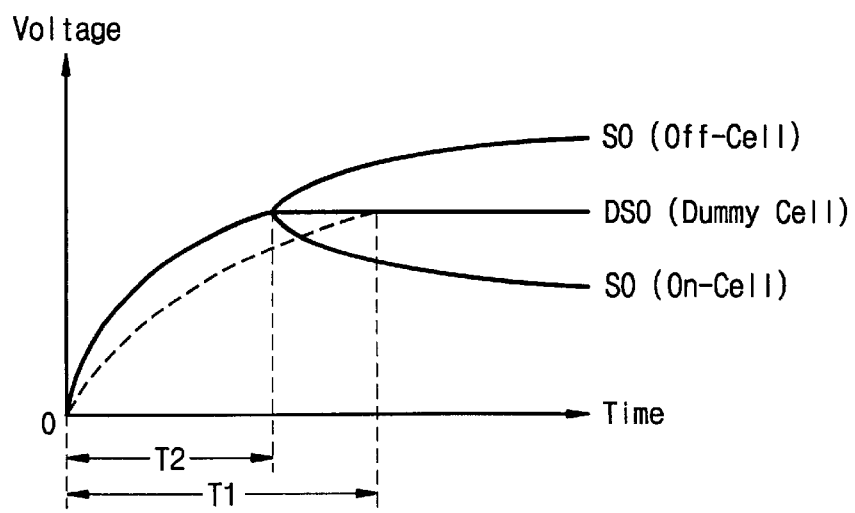
FIG. 2 is a graph showing a relation of reference and input voltages applied to the differential amplifier of FIG. 1.
Figure 3:
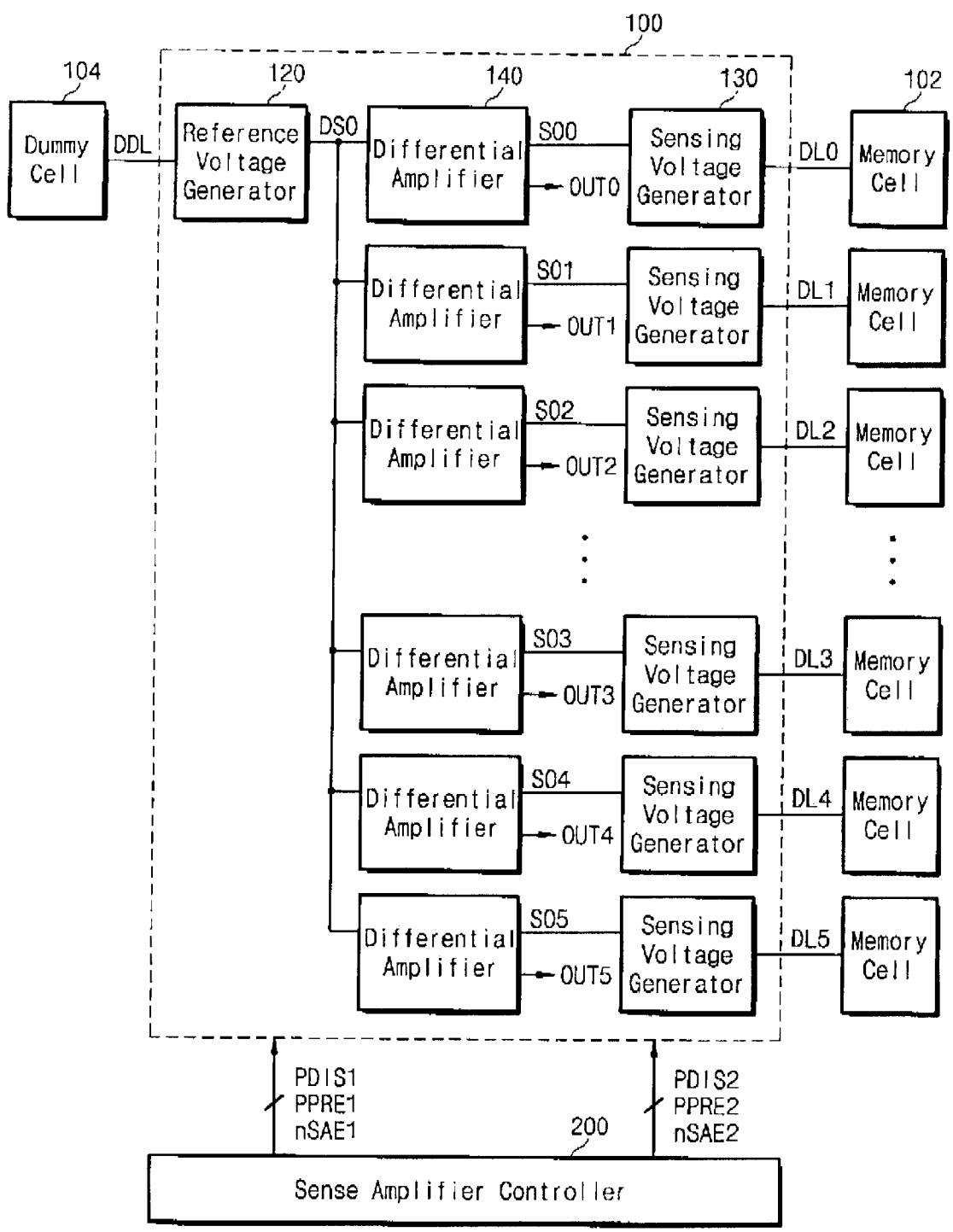
FIG. 3 is a block diagram of a sense amplifier circuitry of a semiconductor memory device in accordance with the present invention.

Referring to FIG. 3 a circuit arrangement of the sense amplifier circuitry of the semiconductor memory device according to the invention is shown. Only selected memory cells 102 are illustrated in FIG. 3. The selected memory cells 102 are connected to sense amplifier circuitry 100 through their corresponding data lines DL0, DL1, . . . , and DL5.

Figures 5, 6:
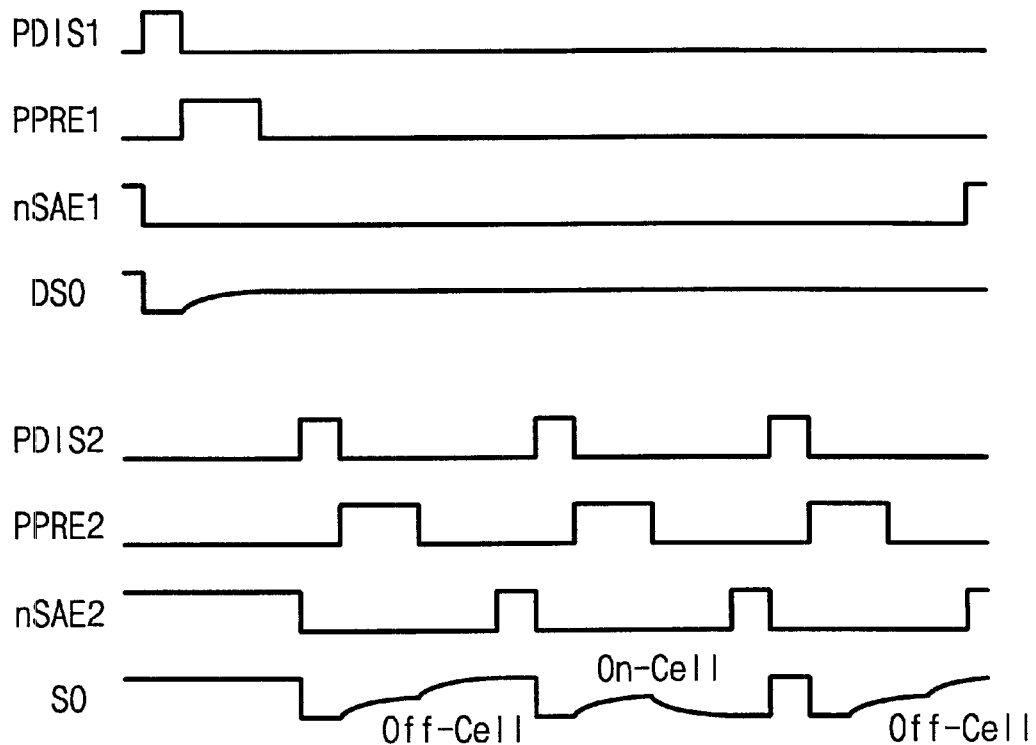
FIG. 5 is a timing view of control signals generated from a sense amplifier controller shown in FIG. 3.
FIG. 6 is a block diagram of a delay circuit generating second control signals in the sense amplifier controller of FIG. 3.

A dummy cell 104 is also connected to the sense amplifier circuitry 100 through a dummy data line DDL. The semiconductor memory device includes a sense amplifier controller 200, which generates first control signals PDIS1, PRE1, and nSAE1, and second control signals PDIS2, PPRE2, and nSAE2, for controlling the sense amplifier circuit 100 during a read operation. The second control signals PDIS2, PPRE2, and nSAE2 are made by delaying the corresponding first control signals for a predetermined time. This is accomplished by using a delay, as shown in FIG. 6.

The sense amplifier circuitry 100 includes a reference voltage generator 120, a plurality of sensing voltage generators 130, and a plurality of differential amplifiers 140. The reference voltage generator 120 is operating in response to the first control signals PDIS1, PPRE1, and nSAE1. The sensing voltage generators 130 are operating in response to the second control signals PDIS2, PPRE2, and nSAE2, respectively. The differential amplifiers 140 correspond to the sensing voltage generators 130, respectively. Each of the differential amplifiers 140 receives a reference voltage of a reference node DS0 and a sensing voltage of a sensing node S0i (i=0–5), and then checks whether the sensing voltage is higher than the reference voltage. Depending on the check result, each of the differential amplifiers 140 outputs a signal OUTi of low or high level.

Figure 4:
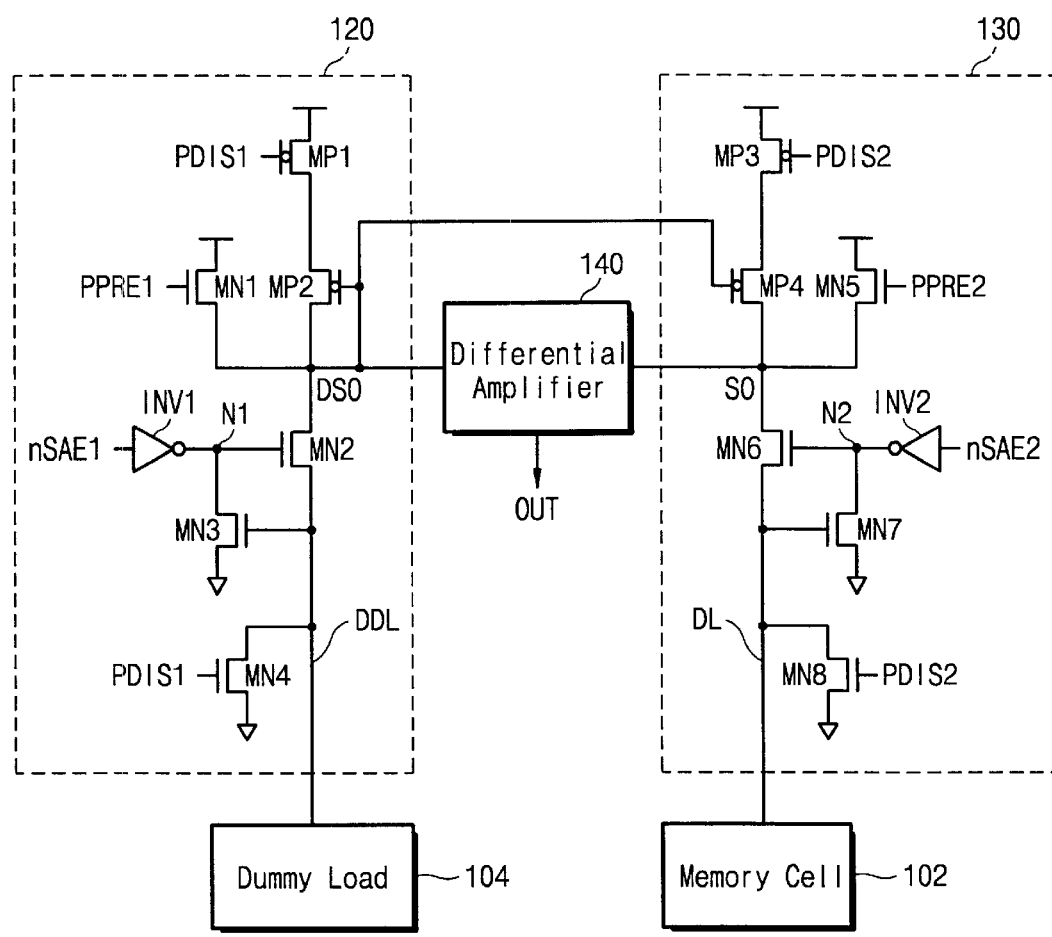
FIG. 4 is a detailed circuit diagram of a reference voltage generator and a sensing voltage generator for a differential amplifier shown in FIG. 3.

In FIG. 4, a reference voltage generator 120 and a sensing voltage generator are illustrated. The reference voltage generator 120 includes two PMOS transistors MP1 and MP2, four NMOS transistors MN1–MN4, and one inverter INV1. The PMOS transistors MP1 and MP2, and the NMOS transistor MN1 compose a current source (or dummy load) that supplies a current to the reference node DS0. The inverter INV1 and the NMOS transistor MN3 compose a bias circuit that generates a bias voltage for controlling a gate voltage of the transistor MN2. The NMOS transistor MN4 serves as a discharge circuit that discharges a voltage of a dummy data line DDL.

The sensing voltage generator 130 may be made similarly to the reference voltage generator 120, except for the fact that the PMOS transistor MP4 is controlled by a reference voltage of a reference node DS0 (has a current mirror architecture). Although only one sensing voltage generator 130 is illustrated in FIG. 4, it is understood to those skilled in the art that remaining sensing voltage generators are also composed similarly to the generator 130. And, although a sensing voltage generator and a reference voltage generator have different architectures, it is understood that a spirit of this invention is applied thereto.

Returning to FIG. 3, if a read operation is started, the sense amplifier controller 200 generates the first control signals PPRE1, PDIS1, and nSAE1 such that the reference voltage generator 120 supplies a reference voltage of required level to the reference node DS0. After the reference voltage is set to constant voltage level, the sense amplifier controller 200 generates the second control signals PPRE2, PDIS2, and nSAE2 such that each of the sensing voltage generators 130 supplies a sensing voltage corresponding to sensing nodes S0i that correspond to the generator 130, respectively. By delaying the first control signals PPRE1, PDIS1, and nSAE1 for a predetermined time, they are utilized as the second control signals PPRE2, PDIS2, and nSAE2, as shown in FIG. 6. This will be explained in detail later.

In FIG. 5, timings between control signals are illustrated. The sense amplifier controller 200 generates first control signals PPRE1, PDIS1, and nSAE1 such that a reference voltage of a reference node DS0 is retained. Based upon first control signals PPRE1, PDIS1, and nSAE1 having such waveforms as shown in FIG. 5, operation for generating a reference voltage in a reference node DS0 is described as follows. Control signals PPRE1 and PRE2 control a precharge operation while PDIS1 and PDIS2 control a discharge operation. And, nSAE1 and nSAE2 control a sensing enable time.

As shown in FIG. 5, as a control signal nSAE1 transitions from high level to low level, a voltage of a node N1 rises up to high level (e.g., power supply voltage level) by an inverter INV1. At the same time as high-to-low transition of the signal nSAE1, a control signal PDIS1 transitions from low level to high level. This makes an NMOS transistor MN4 turned on, so that a dummy data line DDL and a reference node DS0 are discharged to low level (i.e., ground voltage level), respectively. A PMOS transistor MP1 serves to block a direct current path (i.e., VCC-->MP1-->MP2-->MN2-->MN4-->VSS) that may be created during the above-described discharge interval.

Then, the control signal PDIS1 transitions from high level to low level, while the control signal PPRE1 transitions from low level to high level. This makes the transistors MP1 and MN1 turned on, so that a voltage (reference voltage) of a reference node DS0 increasingly rises by a current that is supplied from a current path (or dummy load), as shown in FIG. 5. As the voltage of the node N1 rises, an NMOS transistor MN2 is turned on. By way of the turned-on transistor MN2, a voltage of the dummy data line DDL also rises. As the voltage of the line DDL rises, an NMOS transistor MN3 is turned on.

Under the foregoing conditions, the voltage of the node N1 is decided (fixed) at the time when current supply capability of a pull-up transistor (e.g., PMOS transistor) balances with current discharge capability of the NMOS transistor MN3, in an inverter INV1. Since the control signal PPRE1 then transitions from high level to low level, an NMOS transistor MN1 of a current source is turned off. Therefore, the reference node DS0 receives a current by only PMOS transistors MP1 and MP2 of the current source.

The reference voltage of the reference node DS0 is retained by the difference between a current (corresponding to a half of on and off cell currents) flowing through the dummy cell 104 and a current supplied through the PMOS transistors MP1 and MP2. Namely, the reference voltage generator 120 generates a reference voltage that is required before enabling the sensing voltage generator 130.

After the required reference voltage is set, the sense amplifier controller 200 generates second control signals PPRE2, PDIS2, and nSAE2 such that the sensing voltage generators 130 is enabled. Levels of first control signals PPRE1, PDIS1, and nSAE1 set to have level that a reference voltage requires are retained. An operation that the sensing voltage generator 130 sets voltages of the same level as a reference voltage to corresponding sensing nodes S0i is identical to the above-described operation of the reference voltage generator 120. On the other hand, a voltage (i.e., sensing voltage) of each of the sensing nodes S0i is decided by the difference between a current flowing through a corresponding memory cell 102 and a current flowing through corresponding PMOS transistors MP3 and MP4. Thus, each sensing voltage becomes higher or lower than the reference voltage depending upon a state (on-cell or off-cell) of corresponding memory cells. When the memory cell 102 is an off-cell, the sensing voltage becomes higher than a reference voltage, so that the differential amplifier 140 outputs a high-level signal OUT. When the memory cell 102 is an on-cell, the sensing voltage becomes lower than the reference voltage, so that the differential amplifier 140 outputs a high-level signal OUT.

Although a capacitance value of a reference node DS0 is greater than that of a sensing node S0, a reference voltage of the reference node DS0 is set to voltage level required before a sensing operation is carried out. Therefore, it is possible to prevent problems (e.g., performance degradation of a sense amplifier circuit, difficulty in making a predictable and stable design, etc.). Moreover, the reference voltage of the reference node DS0 is not changed whenever a sensing operation is carried out, reducing a current consumed by the sense amplifier circuit and a noise thereof.

Figure 7:
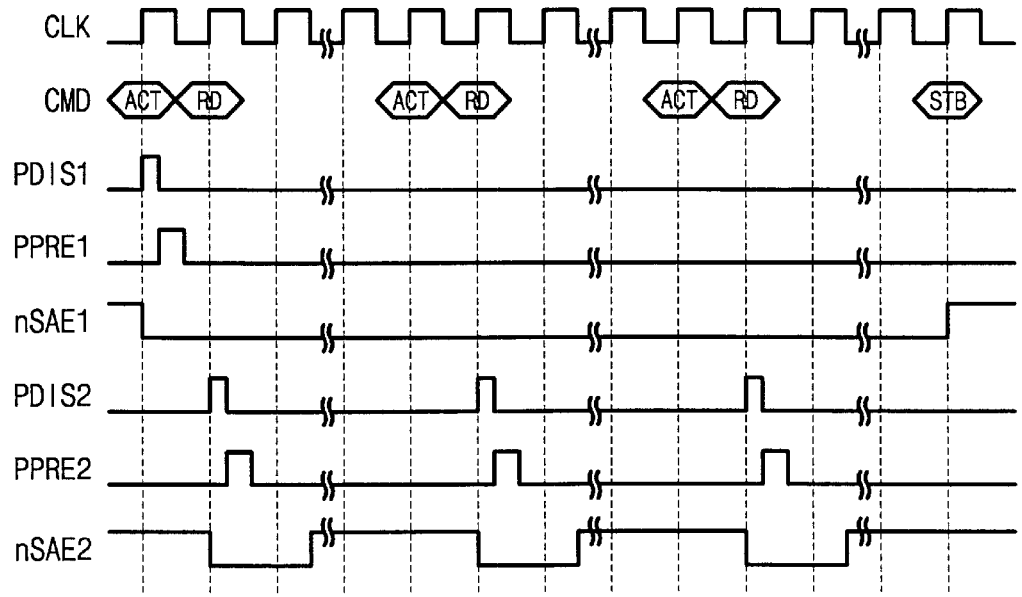
FIG. 7 is a timing view of control signals for the sense amplifier circuitry in a synchronous mask ROM device.
Figure 8:
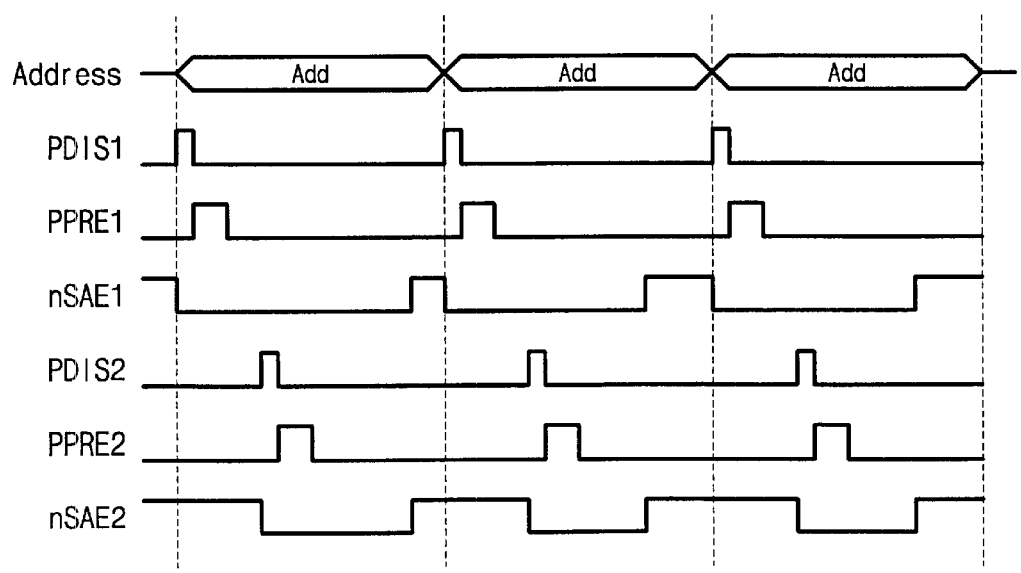
FIG. 8 is a timing view of control signals for the sense amplifier circuitry in an asynchronous mask ROM device.

If a semiconductor memory device of this invention is applied to a synchronous memory device (e.g., synchronous mask ROM device), a sense amplifier controller 200 (see FIG. 3) can be implemented using a state machine of logic gate circuits, as shown in FIG. 7. This results in generation of sense amplifier control signals depending upon an externally applied instruction. For example, the sense amplifier controller 200 generates first control signals PPRE1, PDIS1, and nSAE1 in response to a low address active instruction. Thus, a reference voltage generator 120 sets a reference node DS0 to constant voltage level. In response to a read instruction RD, the sense amplifier controller 200 generates second control signals PPRE2, PDIS2, and nSAE2. Thus, sensing voltage generators 130, corresponding to selected memory cells respectively, is enabled to set sensing voltages to corresponding sensing nodes S0i. Although not shown in the drawings, those skilled in the art can easily implement a sense amplifier controller having such a function.

In this case, the first control signals PPRE1, PDIS1, and nSAE1 is disabled when a semiconductor memory device goes to a disable (standby or unselected) state. On the other hand, the second control signals PPRE2, PDIS2, and nSAE2 are enabled in inputting a read instruction RD, and then are automatically disabled after a predetermined time.

If the semiconductor memory device is applied to an asynchronous semiconductor memory device (e.g., asynchronous mask ROM device), the sense amplifier controller 200 can be implemented using an address transition detection scheme that is well known in the art. For example, the controller 200 generates first control signals PPRE1, PDIS1, and nSAE1 in response to address transition. And then, the controller 200 generates the second control signals PPRE2, PDIS2, and nSAE2 in response to the address transition that is delayed during a predetermined time. When being applied to an asynchronous semiconductor memory device, the first control signals PPRE1, PDIS1, and nSAE1 are enabled during only an interval related with a read operation corresponding to the inputted address.

As described above, although a capacitance value of a reference node is greater than that of a sensing node, a reference voltage of the reference node is set to voltage level that is required before a sensing operation is carried out. Therefore, it is possible to prevent problems (e.g., performance degradation of a sense amplifier circuit, difficulty in making a predictable and stable design, etc.). Moreover, the reference voltage of the reference node DS0 is not changed whenever a sensing operation is carried out, reducing a current consumed by the sense amplifier circuit and a noise thereof. As a result, a stable sense amplifier circuit can be implemented.

Although the preferred embodiments of the present invention are described above, the present invention is not limited to the embodiments since various modifications and changes may be made without departing from the spirit and scope of the general inventive concept as defined by the appended claims and their equivalent.

What is claimed is:

1. A semiconductor memory device comprising:
   a dummy cell;
   a plurality of memory cells arranged at intersections of rows and columns;
   a sense amplifier controller for generating first and second control signals during a read operation; and
   a sense amplifier circuit for internally generating a reference voltage in response to the first control signals and sensing data stored in a selected memory cell in response to the reference voltage and the second control signals, the sense amplifier circuit being coupled to the dummy cell,
   wherein the first control signals are enabled before the second control signals are enabled to set the reference voltage at a constant voltage level.

2. The device of claim 1, wherein the semiconductor memory device is a synchronous device.

3. The device of claim 2, wherein the sense amplifier controller generates the first control signals when a row address active instruction is applied to the memory device, and generates the second control signals when a read instruction is applied thereto.

4. The device of claim 1, wherein the semiconductor memory device is an asynchronous device.

5. The device of claim 4, wherein the sense amplifier controller generates the first control signals in response to a transition of an external address, and generates the second control signals in response to a delayed transition thereof during a predetermined time.

6. The device of claim 1, wherein the sense amplifier circuit includes:

a reference voltage generator for generating and applying the reference voltage to the reference node in response to the first control signals, the reference voltage generator being connected to the dummy cell;

a sensing voltage generator for generating a sensing voltage to a sensing node in response to the second control signals depending upon a state of the selected memory cell; and a differential amplifier for checking whether the sensing voltage is higher than the reference voltage, and outputting one of a high-level signal and a low-level signal, wherein the reference voltage is set to constant voltage level before the sensing voltage generator is enabled.

7. A semiconductor memory device having a plurality of memory cells, the device comprising:

first data lines coupled to corresponding selected memory cells;

a second data line coupled to a dummy cell;

a sense amplifier circuit for sensing data stored in the selected memory cells, the sense amplifier circuit being coupled to the first data lines and to the second data line; and a sense amplifier controller for controlling the sense amplifier circuit during a read operation, wherein the sense amplifier circuit includes a reference voltage generator for generating and applying a reference voltage to a reference node, the reference voltage generator being coupled to the corresponding second data line, sensing voltage generators, each coupled to a corresponding one of the first data lines for generating and applying a sensing voltage to a respective sensing node in response to a state of a corresponding selected memory cell, and differential amplifiers, each coupled to a corresponding one of the sensing voltage generators, wherein each of the differential amplifiers has a first input terminal coupled to the reference node and a second input terminal coupled to the corresponding sensing node of a corresponding one of the sensing voltage generators, and checks whether a corresponding sensing voltage is higher than the reference voltage to output one of a low-level signal and a high-level signal, and wherein the reference voltage generator is enabled by the sense amplifier controller to set the reference voltage at a constant voltage level before the sensing voltage generator is enabled.

8. A method of reading data stored in a semiconductor memory device having a plurality of memory cells arranged at intersections of rows and columns and a sense amplifier circuit for sensing a state of a selected memory cell, the method comprising:

generating a reference voltage using a dummy cell connected to the sense amplifier circuit; and then sensing a state of the selected memory cell in response to the reference voltage, wherein a reference voltage is enabled by a sense amplifier controller to set the reference voltage at a constant voltage level before the sensing voltage generator is enabled.

9. The method of claim 8, wherein the semiconductor memory device is a synchronous device.

10. The method of claim 8, and further comprising:

generating first control signals when a row address active instruction is applied to the memory device; and generating second control signals when a read instruction is applied thereto.

11. The method of claim 10, wherein the sense amplifier circuit includes:

a reference voltage generator for generating the reference voltage in response to the first control signals;

a sensing voltage generator for generating a sensing voltage in response to the second control signals depending upon states of the selected memory cells; and a differential amplifier for checking whether the sensing voltage is higher than the reference voltage, and outputting one of a high-level signal and a low-level signal, wherein the reference voltage is set to constant voltage level before the sensing voltage generator is enabled by the check result.

12. The method of claim 8, and further comprising:

generating first control signals in response to a transition of an external address; and generating second control signals responsive to a delayed transition thereof during a predetermined time.

13. The method of claim 12, wherein the sense amplifier circuit includes:

a reference voltage generator for generating the reference voltage in response to the first control signals;

a sensing voltage generator for generating a sensing voltage in response to the second control signals depending upon states of the selected memory cells; and a differential amplifier for checking whether the sensing voltage is higher than the reference voltage, and outputting one of a high-level signal and a low-level signal, wherein the reference voltage is set to constant voltage level before the sensing voltage generator is enabled by the check result.

* * * * *

UNITED STATES PATENT AND TRADEMARK OFFICE
CERTIFICATE OF CORRECTION

PATENT NO. : 6,404,677 B2
DATED : June 11, 2002
INVENTOR(S) : Dong-woo Lee

It is certified that error appears in the above-identified patent and that said Letters Patent is hereby corrected as shown below:

<u>Column 1,</u>
Line 54, "one-cell" should read -- on-cell --;

<u>Column 3,</u>
Line 50, "PRE1" should read -- PPRE1 --;

<u>Column 8,</u>
Line 26, should read:
-- 11.   The method of claim 8, and further comprising:
            generating first control signals in response to a transition of an external address; and
            generating second control signals responsive to a delayed transition thereof during a predetermined time. --

Line 42, should read:
            -- 12.   The method of claim 10, wherein the sense amplifier
                circuit includes:
                a reference voltage generator for generating the reference
            voltage in response to the first control signals;
                a sensing voltage generator for generating a sensing
            voltage in response to the second control signals
            depending upon states of the selected memory cells;
            and

UNITED STATES PATENT AND TRADEMARK OFFICE
CERTIFICATE OF CORRECTION

PATENT NO.    : 6,404,677 B2
DATED         : June 11, 2002
INVENTOR(S)   : Dong-woo Lee It is certified that error appears in the above-identified patent and that said Letters Patent is hereby corrected as shown below:

<u>Column 8 cont'd,</u>
    a differential amplifier for checking whether the sensing
voltage is higher than the reference voltage, and out-
putting one of a high-level signal and a low-level
signal,
    wherein the reference voltage is set to constant voltage
level before the sensing voltage generator is enabled by
the check result. --

Signed and Sealed this

Eighteenth Day of February, 2003

JAMES E. ROGAN
*Director of the United States Patent and Trademark Office*